United States Patent
Ren et al.

(10) Patent No.: US 7,368,668 B2
(45) Date of Patent: May 6, 2008

(54) GROUND SHIELDS FOR SEMICONDUCTORS

(75) Inventors: Xiaowei Ren, Phoenix, AZ (US);
Robert A. Pryor, Mesa, AZ (US);
Daniel J. Lamey, Phoenix, AZ (US)

(73) Assignee: Freescale Semiconductor Inc., Austin, TX (US)

( * ) Notice: Subject to any disclaimer, the term of this patent is extended or adjusted under 35 U.S.C. 154(b) by 0 days.

(21) Appl. No.: 11/347,461

(22) Filed: Feb. 3, 2006

(65) Prior Publication Data
US 2007/0181339 A1    Aug. 9, 2007

(51) Int. Cl.
*H05K 9/00* (2006.01)
(52) U.S. Cl. .................. 174/382; 174/377; 257/659
(58) Field of Classification Search ............ 257/239, 257/659, 660; 174/382, 377
See application file for complete search history.

(56) References Cited
U.S. PATENT DOCUMENTS

| | | | |
|---|---|---|---|
| 5,594,279 A | 1/1997 | Itou et al. | |
| 5,616,952 A | 4/1997 | Nakano et al. | |
| 6,611,041 B2 | 8/2003 | Maeda et al. | |
| 6,744,117 B2 | 6/2004 | Dragon et al. | |
| 2007/0007557 A1* | 1/2007 | Kwak et al. ............... | 257/239 |

* cited by examiner

*Primary Examiner*—Hung V. Ngo
(74) *Attorney, Agent, or Firm*—Ingrassia, Fisher & Lorenz P.C.

(57) ABSTRACT

A semiconductor device, such as a RF LDMOS, having a ground shield that has a pair of stacked metal layers. The first metal layer extends along the length of the semiconductor device and is formed on the upper surface of the semiconductor device body. The first layer has a series of regularly spaced apart lateral first slots. The second metal layer, coextensive with and located above the first metal layer, has a series of regularly spaced apart lateral second slots. The second slots overlie the spaces between the first slots, and the continuous portions of the second metal layer overlie the first slots. The slots are substantially parallel to wires extending over the ground shield. The ground shield is not limited to only two metal layers. The ground shield has a repeating unit design that facilitates automated design.

18 Claims, 3 Drawing Sheets

GROUND SHIELDS FOR SEMICONDUCTORS

TECHNICAL FIELD

The present invention relates generally to semiconductor devices. More particularly, the present invention relates to ground shields to reduce or eliminate electromagnetic interference or loss from wire over semiconductor devices, such as in laterally diffused metal-oxide semiconductor (LDMOS) device applications.

BACKGROUND

Radio frequency (RF) laterally diffused metal-oxide semiconductor (LDMOS) power transistors provide good performance in the frequency range that are used in cellular base stations, and like applications. Typically, a high power LDMOS uses wires and on-chip integrated capacitors to achieve an impedance match for device input and output. The device includes a chip with input and output wires that extend over at least part of the chip to capacitors at outboard sides of the device, and a ground shield to minimize or prevent interference resulting from electromagnetic fields generated when current flows through the wires. The use of a so-called Faraday Shield to reduce interference is well known, but shield designs vary.

U.S. Pat. No. 6,744,117 relates to a method of manufacturing RF LDMOS and shows a ground shield that has two metal layers. Briefly, FIGS. 2 and 3 of the '117 patent shows a first ground shield formed (by metallic deposit), along with a first set of drain contacts. A second interlevel dielectric layer (ILD1) is formed over the first ground shield and the contacts. The second ohmic or metal layer is then formed over ILD1 and is patterned to provide a ground shield and drain contacts. The second ground shield has electrical connection with first ground shield. The structure shown is suitable for plastic packaging.

Another LDMOS ground shield design is shown in FIG. 1, in top view. This design shows a shielded device 10 that includes a chip 24 with an output ground shield 18 and input ground shield 19. The device 10 has circuitry 26, inboard wire pads 12, 13 on either side of the circuitry 26, each having an outboard wire pad 14, 15, respectively, for wire connection on over the ground shield on each side of the device. The capacitors 16, formed on chip 24, are located along the opposed sides of the device. Wires, not shown, extend over a portion of the chip 24 from inboard pad 12 to outboard pad 14; and from inboard pad 13 to outboard pad 15. Thus, the wires cross over above the ground shields 18, 19 and these shields must prevent or minimize interference from and loss by the overhead wires. The ground shields 18, 19 are each continuous, stretching along the entire length of the device where there are overhead wires, to shield it. The shields 18, 19 are each of two metal layers, with the upper layer and lower layer (not shown). An array of vias 20 extends beneath the upper metal layer and represents the only discontinuities in the topography of upper metal layer.

With a large, high-powered device, heat is generated during operation, and metallic components tend to expand at a higher rate, and to a greater extent, with increase in temperature than semiconductor materials because of differences in coefficients of thermal expansion (CTE). This expansion differential introduces mechanical stresses into the device that might shorten its life, or affect performance, or both. Because of these CTE differences, the ground shield as described in FIG. 1 is susceptible to thermally-induced stress (metal has a higher coefficient of thermal expansion than the chip) leading to passivation cracks and delamination. Further, there is an adverse etch loading effect during fabrication of the shield at the contacts and vias due to the large areas to be etched.

Accordingly, it is desirable to develop ground shields, especially for large, high-powered LDMOS, which are more compatible with the coefficient of thermal expansion of the semiconductor materials of the device, while at the same time providing good shielding from electromagnetic effects. It is further desirable to reduce the etch loading effect at contact and via during fabrication of these shields. In addition it is also desirable that the shields are suitable for manufacture with automated design tools. These and other desirable features and characteristics of the embodiments of the present disclosure will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, which are schematic, not to scale, and wherein like reference numbers refer to similar elements throughout the figures.

DETAILED DESCRIPTION

Figure 1:
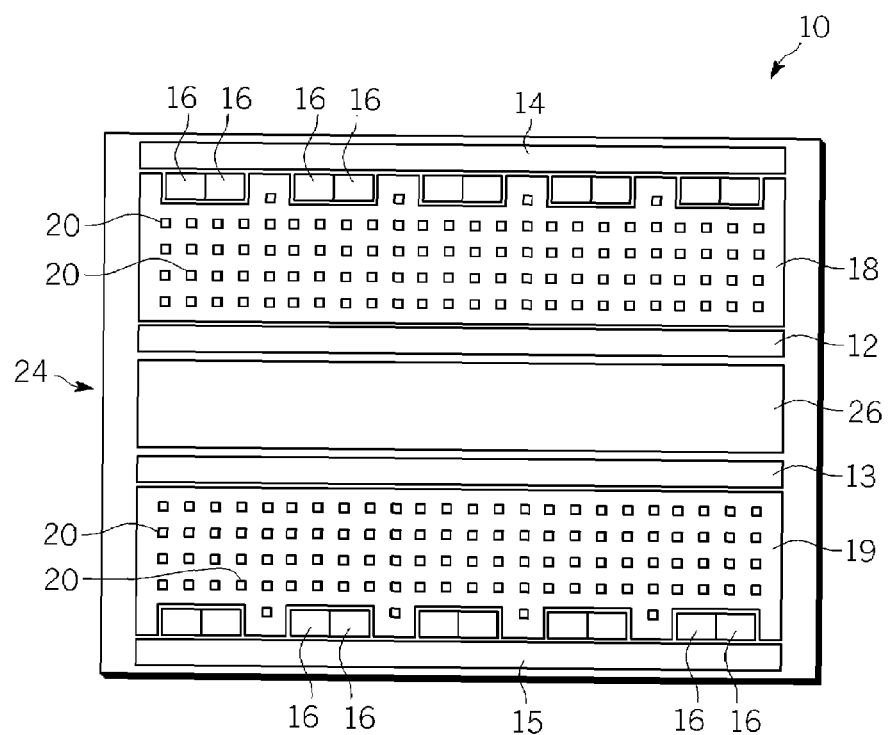
FIG. 1 is a top view of a prior art RF LDMOS.

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

For the sake of brevity, conventional techniques related to semiconductor fabrication and ground shield design may not be described in detail herein. It should be noted that many alternative or additional features may be present in a practical embodiment.

The invention addresses several problems that are typically encountered in ground-shielded semiconductor devices, such as RF LDMOS, and provides practical solutions to these problems. Among the advantages of the invention are, for example, the reduction in thermally-induced mechanical stresses that arise from mismatch between the coefficients of thermal expansion of the ground shield and the semiconductor materials. These stresses, which are particularly acute as the size of the device (and hence ground shield size) increases, are significantly reduced in devices of the invention, through the structure of the ground shield. While the invention is applicable to virtually any size device, its reduction in thermally-induced stresses is especially useful in devices where the ground shield area exceeds, for example, about five square millimeters, because in larger devices thermally-induced stresses are typically greater. The embodiments of the present disclosure are also appropriate for other ground shield sizes than five square millimeters or more. In addition, the often encountered semiconductor processing issue of severe loading effects due to the pattern density at contact and via etching is reduced. Further, the invention facilitates the use of automated design tools because it provides a ground shield design that is made up of a unit cell (also referred to herein as a "finger") that repeats throughout the length of the ground shield. The unit cell or "finger" includes alternating contacts and vias, as explained in more detail here below, and can be varied in size to accommodate different sizes of device. The finger also facilitates automated design. This automated implementation provides potential cost savings.

In one embodiment, the invention provides a ground shield for a semiconductor device that has a pair of stacked metal layers. Such layers may each be composed of a single composition in a single layer or of a combination of several sub-layers formed on top of each other, where the layers are of differing or the same composition. The first metal layer extends along the length of the semiconductor device and is formed on the upper surface of the semiconductor device body. The first layer has a series of regularly spaced apart lateral first slots. The second metal layer, coextensive with and located above the first metal layer, has a series of regularly spaced apart lateral second slots. The second slots overlie the spaces between the first slots, and the continuous portions of the second metal layer overlie the first slots. Thus no part of the semiconductor body upper surface beneath the two layers is exposed. In a similar manner, the embodiments of the present disclosure may include more than two metal layers. In multiple stacked arrays, subsequent layers include slots that overlie spaces between slots of an underlying previous layer.

In another embodiment, the invention provides a semiconductor device that includes a ground shield. In general, the device includes a semiconductor body that has a pair of wire pads extending along each side. Since the wire pads and ground shield arrangements are similar on each side, only one side is addressed for brevity. Each side has an inboard wire pad located on the semiconductor body and extending along a length of the device; and an outboard wire pad located on the semiconductor body, extending along a length of the device. The wire pads may be continuous or segmented. The device has ground shields on its upper surface, one on each side, located between the inboard and outboard wire pads. The ground shield extends along a length of the device and it includes two stacked and coextensive metal layers. The first metal layer is laid down on the semiconductor body and has a series of regularly spaced apart lateral first slots. The second metal layer, above the first metal layer, has a series of regularly spaced apart lateral second slots. The two layers are juxtaposed such that second slots overlie spaces between the first slots of the first metal layer, and the second metal layer overlies the first slots. The slots are aligned laterally to be substantially parallel to wires extending over the ground shield from the inboard pad to the outboard pad. This alignment minimizes any compromise of the effectiveness of the ground shield that might be expected from the reduction of the metal layer contact area (increase in shield resistance) to the underlying device.

Figure 6:
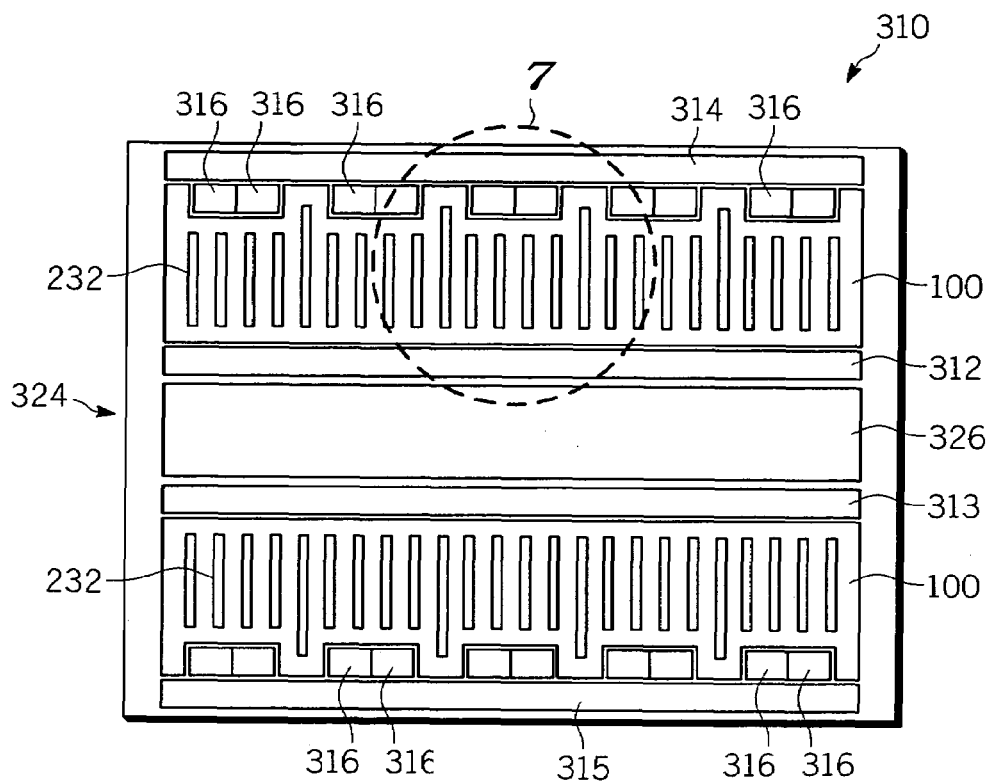
FIG. 6 is a top view of an embodiment of the invention showing a device with input and output ground shields.
Figure 7:
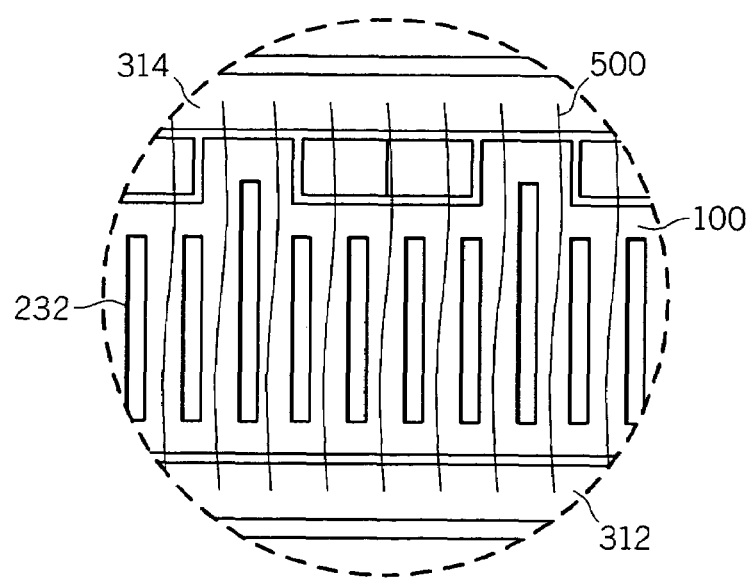
FIG. 7 is an expanded top view of a portion of the embodiment of FIG. 6 of the invention showing overhead wires.

A brief preliminary consideration of FIGS. 6 and 7 may provide an overview of a device according to an embodiment of the invention. In the embodiment shown in top view, the device 310 has a pair of ground shields 100 that have regularly spaced slots 232. Wires 500 extend over the ground shields 100 from wire pad 312 to 314, and from wire pad 313 to pad 315. These FIGS. will be discussed in more detail here below.

Figure 2:
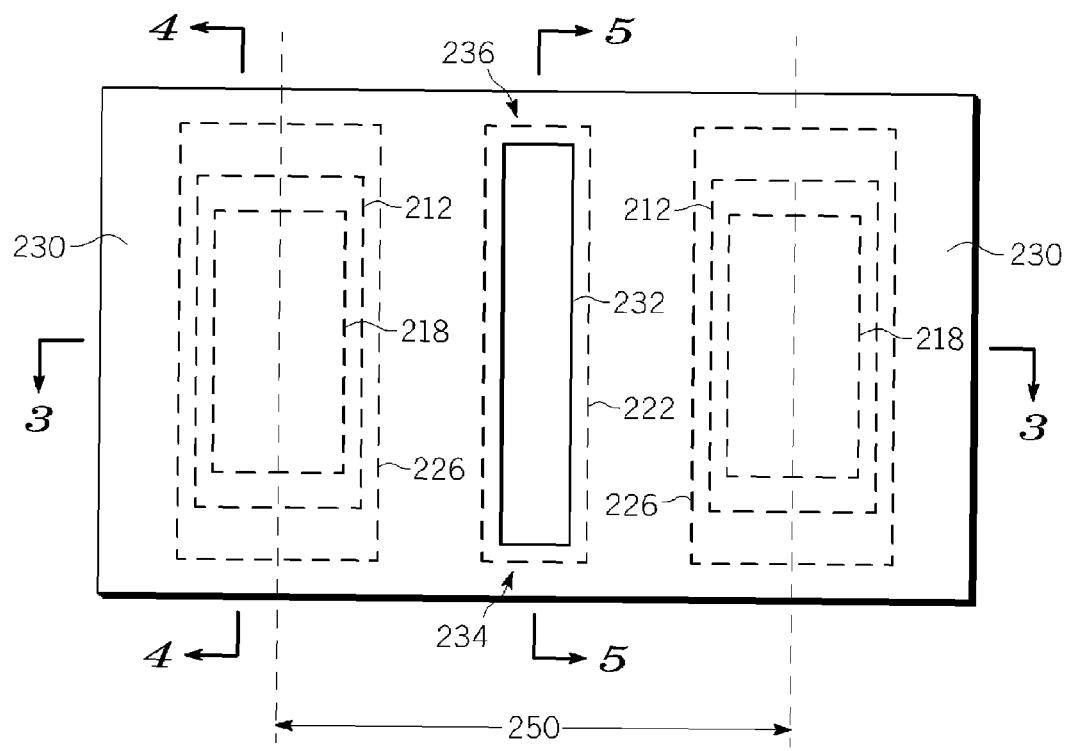
FIG. 2 is a top view of an embodiment of the invention, showing a single unit that may be sized and replicated as many times as needed for a required ground shield application.
Figure 3:
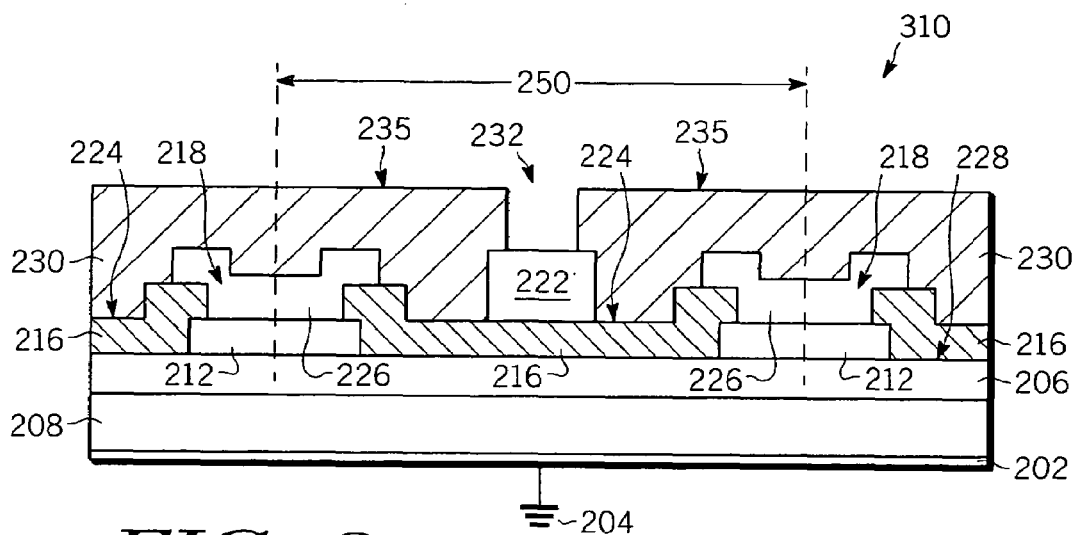
FIG. 3 is a cross section taken at 3-3 of FIG. 2.
Figure 4:
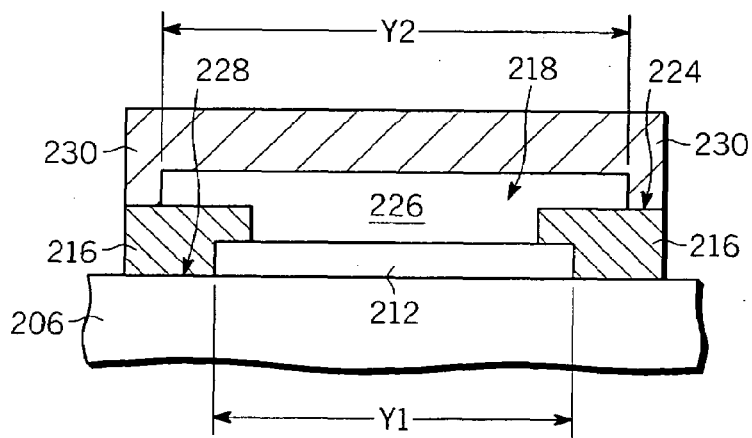
FIG. 4 is a cross section taken at 4-4 of FIG. 2.
Figure 5:
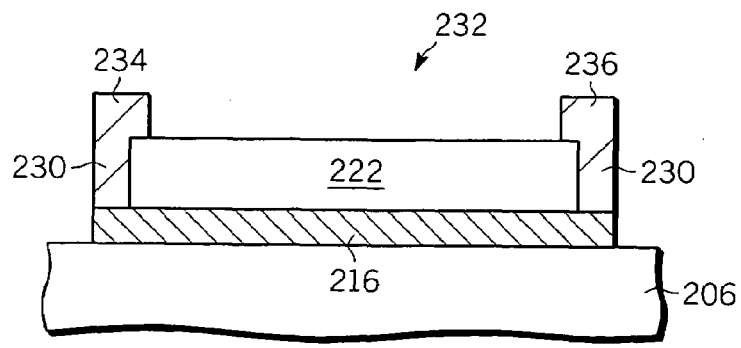
FIG. 5 is a cross section taken at 5-5 of FIG. 2.

To facilitate an appreciation of the invention, an example of a method of making the device will be explained, with reference to the attached figures, especially FIGS. 2-5. FIG. 2 depicts a top view of a repeating unit 250 that when replicated can be used to fabricate a ground shield 100 (see FIG. 6). This replication may be in one or the other of the x or y directions, depending upon shield design. In one embodiment, replication occurs in the x-direction, however. Each of FIGS. 3, 4 and 5 shows a cross sectional view taken at a location shown in FIG. 2. In FIG. 2, underlying structure, not visible but explained herein with reference to the cross sections, are outlined in broken lines. It will become apparent that these lines show the extent of area of each of the underlying features, and their relationship to each other in a vertical stack.

In fabricating the ground shield shown in FIG. 2, the following example of a processing scheme may be used, although clearly other schemes are possible. Referring to FIGS. 2 and 3, in particular, after an optional epitaxy layer (for an under-side ground design) 206 is formed on the substrate 208, a first interlevel dielectric layer (ILD0) is laid down. Interlevel dielectric layers may be a single film or may be made up of a series of layered films. The ILD0 layer may then be etched into a pattern that provides a series of equally spaced apart islands of ILD0 212. Where ILD0 has been etched away openings remain that may provide contacts to the optional epitaxy layer 206 or substrate 208. The first metal layer 216 is laid down as a conformal layer over the ILD0 islands, using any suitable metal deposition technology. The metal layer 216 may then be etched to produce a pattern of a series of slots 218 in the layer, that are equidistant and that coincide with the ILD0 islands 212. Thus, the etched metal layer 216 covers the upper surface of the substrate 206 except for the areas covered by the ILD0 islands 212. As shown, the etching process may retain some overlap of metal 216 over perimeters of the ILD0 islands 212 to prevent exposure of underlying structure. Next, a conformal ILD1 layer is deposited over metal layer 216 and the exposed ILD0 islands 212. This layer fills in the slots 218 in metal layer 216, and extends above the metal layer. The ILD1 layer is then etched to produce islands 222 of ILD1 and islands 226 of ILD1, between which vias 224 are enabled. Next, the second layer of metal 230 is applied and etched to produce a series of slots 232 and polished if desired for a smooth upper surface 235. The ILD1 islands 222 under the slots 232 in the second metal layer are adjacent to vias 224. It is clear from FIG. 3 that there is a repeating unit cell, or "finger" 250, comprising contact and via, resulting from the patterning of the metal layers. The finger represents the basic unit of the ground shield 100. When finger 250 is replicated laterally along the length of the device to be shielded, it forms the ground shield 100.

Bearing the forgoing in mind, the structure of FIG. 2 may now be more readily understood: it depicts a repeating unit 250 of a ground shield 100. The repeating unit 250 has a second (upper) metal layer 230 that has a slot 232 over ILD1 islands 222. The lower or first metal layer 216 beneath has slots 218 over islands of ILD0 212. The ILD0 is surrounded and overlaid by islands of ILD1 226. Finally the second metal layer 230 overlies the islands of ILD1 222 and 226 and the first metal layer 216, with the exception of a portion over ILD1 island 222 that corresponds to slot 232.

Referring now to FIG. 3, a cross section of FIG. 2 at 3-3, it depicts a portion of a device 310 that has a metal backing layer 202 that is connected to a ground 204. Of course, other grounding systems can also be used; for example, the shield may be grounded from the top, which may be more suitable or desirable in some devices. The device 310 has a first layer 206 which may be an epitaxy layer and is highly doped to assist electrical conduction. Here, it is an underlying P+ substrate layer 208. The P+ doping in epitaxy and substrate may not be necessary depending upon the location of the ground in a given semiconductor device application.

FIG. 4 is a cross section at 4-4 of FIG. 2, taken laterally across the ground shield 100 at the ILD0 island 212 and the ILD1 island 226. The lower island of ILD0 212 of width Y1 laid down on the epitaxy layer, in this embodiment. The ILD0 island 212 is overlaid with the ILD1 island 226 of width Y2. The dimensions of Y1 and Y2 can be selectively varied to fine tune the contact 228 and via 224 areas to ensure that etch loading effects are controlled within the process. For example, it may be desirable, but not strictly necessary, to maintain the contact etch area at no larger than about sixty percent (60%) and the via etch area at no larger than about forty percent (40%) of the ground shield area. In other words, a contact area of a first metal layer on the semiconductor body may be less than about sixty percent of the ground shield area. In addition, a via area of a second metal layer, above the first metal layer, may be less than about forty percent based on the ground shield area.

In the embodiment of FIG. 4, the upper surface of ILD0 island 212 is below the upper surface of the first metal layer 216 surrounding island 212. Thus, ILD1 intrudes into the upper portion of the slot 218 in first metal layer 216.

Turning now to the cross section 5-5 taken at the ILD1 island 222 of FIG. 2, which is shown in FIG. 5, the first metal layer 216 covers the underlying epitaxy layer 206 that was applied in this embodiment. The ILD1 island 222 overlies the metal layer 216, and lies beneath the slot 232 of second metal layer 230. Here, the island 222 is flanked by the continuous inboard 234 and outboard 236 portions of second metal layer 230.

While the invention is very useful in large, high-powered, ground-shielded semiconductor devices (over 5 mm square shields), it is also useful in smaller devices. The invention is generally useful in any on-chip, integrated, very large ground shield designs using on-chip wire-bonds in semiconductors. It is especially useful in, for example, RF LDMOS devices.

FIG. 6 is a top view of an embodiment of the invention depicting a ground-shielded device 310. Here, the device 310 includes an integrated chip 324 that has circuitry 326, capacitors 316 along its sides, and a pair of ground shields 100. The shields are located between inboard wire pads 312, 313, and outboard wire pads 314, 515, respectively. While the device is shown as symmetrical, for ease of illustration, it is noted that the device may also be non-symmetrical. Any change in symmetry has no effect on the principle of the embodiments of the disclosure. The slots 232 in the upper metal layer of the ground shields 100 are visible.

FIG. 7 is an expanded view of a portion of the device 310 described in FIG. 6 but with the addition of wires 500 extending across the ground shield 100 from inboard wire pad 312 to outboard pad 314. The wires 500 are substantially parallel to the slots 232.

In one aspect, the invention provides a ground shield for a semiconductor device that includes a first metal layer on a semiconductor body. The first layer has a series of regularly spaced apart lateral first slots therein. The shield also includes a second metal layer above the first metal layer. The second layer includes a series of regularly spaced apart lateral second slots such that the second slots overlie spaces between the first slots, and the second metal layer overlies the first slots. The second slots overlie islands of ILD1, the islands laid on the first metal layer. The first slots have islands of ILD0 therein, of width Y1. The ILD0 island may be overlaid by an island of ILD1 having a width of Y2, where Y2 is equal or greater than Y1. The ground shield may be designed for a contact area of less than about sixty percent (60%) based on the ground shield area. The ground shield may have a via area of less than about forty percent (40%) based on the ground shield area. Further, the ground shield may be greater than about five square millimeters in area.

In another aspect, the invention provides a semiconductor device that includes a semiconductor body; an inboard wire pad located on the semiconductor body and extending along a length of the device; and an outboard wire pad located on the semiconductor body, extending along a length of the device. The outboard pad is spaced further from a longitudinal axis of the chip than the inboard pad. The device also has a ground shield located between the inboard and outboard pad, the ground shield extending along a length of the device. The ground shield includes a first metal layer on the semiconductor body. The first layer comprising a series of regularly spaced apart lateral first slots. The shield also has a second metal layer above the first metal layer, the second layer comprising a series of regularly spaced apart lateral second slots. The second slots overlie spaces between the first slots, and the second metal layer overlies the first slots. The device may further include a wire extending over the ground shield, from the inboard pad to the outboard wire pad, substantially parallel to slots in the first and second metal layers. In the device, the patterning of the first and second metal layers may form a finger that is a repeating unit making up the ground shield. The second slots of the device may include therein ILD1, where the ILD1 is laid on the first metal layer. Further, the first slots may include therein islands of ILD0, each island of ILD0 having a width Y1. The ILD0 islands may be overlaid with islands of ILD1, each ILD1 island having a width of Y2, where Y2 is greater than Y1. Shield properties may be manipulated by proper selection of Y1 and Y2. In addition the contact area may be less than about 60% based on the ground shield area. And, the via area may be less than about 40% based on the ground shield area. In one aspect, the device is large and the area of the ground shield is greater than about 5 square millimeters. The device may be an RF LDMOS chip. In this instance, the device may include a highly doped implant layer under the ground shield and a back-side ground.

In a further aspect, the invention provides a method of making a ground shield that includes: forming an ILD0 layer on the semiconductor body to be grounded; etching the ILD0 layer to form islands; forming a conformal first metal layer over the islands of ILD0 and the semiconductor body; etching the first metal layer to define regularly spaced apart slots therein; forming a conformal ILD1 layer over the etched first metal layer; etching the ILD1 layer to define islands on the first metal layer and on the islands of ILD0; forming a conformal second metal layer over the ILD1 and the exposed first metal layer; and etching the second metal layer to create slots at regular intervals, the slots directly above islands of ILD1 on the first metal.

The method may include, in some instances, forming a highly doped implant layer on the semiconductor body before forming the ILD0 layer.

While at least one example embodiment has been presented in the foregoing detailed description, it should be appreciated that a vast number of variations exist. For example, the embodiments could be implemented a) using other spacing patterns (regular, irregular, etc.) according to the principle of stress reduction expressed herein, b) using multiple layers of metal and interlevel dielectric, and c) using slots and islands formed as segments. Accordingly it should be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A ground shield for a semiconductor device of the type that includes a set of conductive wires, comprising:
   a first metal layer on a semiconductor body, the first layer comprising a series of regularly spaced apart lateral first slots therein; and
   a second metal layer above the first metal layer, the second layer comprising a series of regularly spaced apart lateral second slots therein, the second slots overlying spaces between the first slots, and the second metal layer overlying the first slots;
   wherein each of the first and second metal layers are electrically contiguous and are positioned over the set of conductive wires such that the first and second metal layers form the ground shield with respect to the conductive wires.

2. The ground shield of claim 1, wherein the second slots comprise therein islands of an interlevel dielectric ILD1, the islands laid on the first metal layer.

3. The ground shield of claim 1, wherein the first slots comprise therein islands of an interlevel dielectric ILD0, the ILD0 islands having a width Y1.

4. The ground shield of claim 3, wherein an ILD0 island is overlaid by an island of ILD1 having a width of Y2, where Y2 is greater than or equal to Y1.

5. The ground shield of claim 1, wherein a contact area of the first metal layer on a semiconductor body is less than about sixty percent based on the ground shield area.

6. The ground shield of claim 1, wherein a via area of the second metal layer on the first metal layer is less than about forty percent based on the ground shield area.

7. The ground shield of claim 1, wherein the area of the ground shield is greater than about five square millimeters.

8. A semiconductor device comprising:
   a semiconductor body;
   an inboard wire pad located on the semiconductor body and extending along a length of the device;
   an outboard wire pad located on the semiconductor body, extending along a length of the device, the outboard pad spaced further from a longitudinal axis of the chip than the inboard pad; and
   a ground shield located between the inboard and outboard pad, the ground shield extending along a length of the device, the ground shield comprising:
   a first metal layer on the semiconductor body, the first layer comprising a series of regularly spaced apart lateral first slots therein; and
   a second metal layer above the first metal layer, the second layer comprising a series of regularly spaced apart lateral second slots therein, the second slots overlying spaces between the first slots, and the second metal layer overlying the first slots.

9. The device of claim 8, further comprising a wire extending over the ground shield, from the inboard pad to the outboard wire pad, substantially parallel to slots in the first and second metal layers.

10. The device of claim 9, wherein slotted patterning of the first and second metal layers form a repeating unit of the ground shield.

11. The device of claim 8, wherein the second slots comprise therein interlevel dielectric ILD1, the ILD1 laid on the first metal layer.

12. The device of claim 8, wherein first slots comprise therein islands of interlevel dielectric ILD0, each island of ILD0 having a width Y1.

13. The device of claim 12, wherein ILD0 islands are overlaid with islands of ILD1, each ILD1 island having a width of Y2, where Y2 is greater than or equal to Y1.

14. The device of claim 8, wherein a contact area of the first metal layer on a semiconductor body is less than is less than about sixty percent based on the ground shield area.

15. The device of claim 8, wherein a via area of the second metal layer on the first metal layer is less than about forty percent based on the ground shield area.

16. The device of claim 8, wherein the area of the ground shield is greater than about five square millimeters.

17. The device of claim 8, wherein the device comprises an RF LDMOS chip.

18. The device of claim 17, wherein the device further comprises a highly doped implant layer under the ground shield and a back-side ground.

* * * * *